US009806728B1

(12) United States Patent
Sugimoto et al.

(10) Patent No.: US 9,806,728 B1
(45) Date of Patent: Oct. 31, 2017

(54) AMPLIFIER CIRCUIT

(71) Applicant: KABUSHIKI KAISHA TOSHIBA, Tokyo (JP)

(72) Inventors: Tomohiko Sugimoto, Kanagawa (JP); Hirotomo Ishii, Kanagawa (JP); Kentaro Yoshioka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/441,075

(22) Filed: Feb. 23, 2017

(30) Foreign Application Priority Data

Sep. 1, 2016 (JP) ................................. 2016-171117

(51) Int. Cl.
| H03M 1/06 | (2006.01) |
| H03F 3/45 | (2006.01) |
| H03M 1/00 | (2006.01) |
| H03F 3/00 | (2006.01) |
| H03M 1/44 | (2006.01) |

(52) U.S. Cl.
CPC ............ H03M 1/001 (2013.01); H03F 3/005 (2013.01); H03F 3/45596 (2013.01); H03M 1/0602 (2013.01); H03M 1/0607 (2013.01); H03F 2200/375 (2013.01); H03F 2200/78 (2013.01); H03M 1/44 (2013.01)

(58) Field of Classification Search
None
See application file for complete search history.

(56) References Cited

U.S. PATENT DOCUMENTS

| 4,495,470 A * | 1/1985 | Bristol ............... H03F 1/304 330/51 |
| 6,433,712 B1 | 8/2002 | Ohnhaeuser et al. |
| 8,593,314 B2 | 11/2013 | Haneda et al. |
| 8,994,572 B2 * | 3/2015 | San ..................... H03M 1/0695 341/118 |
| 2016/0352349 A1 | 12/2016 | Yoshioka et al. |

FOREIGN PATENT DOCUMENTS

| JP | S59-46131 B2 | 11/1984 |
| JP | 2012-151561 | 8/2012 |
| JP | 2016-025552 | 2/2016 |

\* cited by examiner

*Primary Examiner* — Howard Williams
(74) *Attorney, Agent, or Firm* — Patterson & Sheridan, LLP

(57) ABSTRACT

An amplifier circuit includes a sampling circuit and an amplifier connected to an output of the sampling circuit. A feedback capacitor is between an output terminal of the amplifier and an output terminal of the sampling circuit. A quantizer that includes a comparator is configured to quantize a voltage at the output terminal of the sampling circuit according to a comparison of a voltage at the output terminal of the sampling circuit to a voltage at the reference potential terminal of the comparator. The quantizer outputs a digital code according to the voltage comparison. A control circuit receives the digital code from the quantizer and stores the digital code in a register as a cancellation digital code. A digital-analog (D/A) converter outputs an analog signal in accordance with digital codes from the control circuit.

20 Claims, 17 Drawing Sheets

AMPLIFIER CIRCUIT

CROSS-REFERENCE TO RELATED APPLICATION

This application is based upon and claims the benefit of priority from Japanese Patent Application No. 2016-171117, filed Sep. 1, 2016, the entire contents of which are incorporated herein by reference.

FIELD

Embodiments described herein relate generally to an amplifier circuit.

BACKGROUND

In the related art, technologies for correcting offsets of amplifiers are disclosed. Amplifier circuits including operational amplifiers and comparators are known. Such amplifier circuits can correct errors of the operational amplifiers equal to or less than a constant value. However, when differences (relative offsets) between offsets of the operational amplifiers and offsets of comparators are large, there is a possibility that the errors exceed ranges for which calibration is possible. Here, an "error of an operational amplifier" is an error caused due to a finite gain of the operational amplifier. The "offset" is caused due to an element variation or the like. When a relative offset between the operational amplifier and the comparator is large, desired amplification precision of the amplifier circuit may not be accomplished.

DETAILED DESCRIPTION

In general, according to one embodiment, an amplifier circuit includes a sampling circuit configured to sample a voltage of an input signal and an amplifier having an input terminal connected to an output terminal of the sampling circuit. A feedback capacitor is connected between an output terminal of the amplifier and the output terminal of the sampling circuit. A quantizer includes a comparator that has a first input terminal connected to the output terminal of the sampling circuit and a second input terminal connected to a reference potential terminal. The quantizer is configured to quantize a voltage at the output terminal of the sampling circuit according to a comparison of the voltage at the output terminal of the sampling circuit to a voltage at the reference potential terminal. The quantizer outputs a digital code according to the comparison. A control circuit receives the digital code from the quantizer and including a register for storing the digital code as a cancellation digital code for cancelling a difference between an offset of the amplifier and an offset of the comparator. A first digital-analog (D/A) converter is configured to output an analog signal in accordance with digital codes from the control circuit.

Hereinafter, example embodiments will be described with reference to the drawings. The examples are presented for the description of various aspects of the disclosure and disclosed embodiments are not limited to the specific example embodiments presented.

1 First Embodiment

1-1 Configuration

Figure 1:
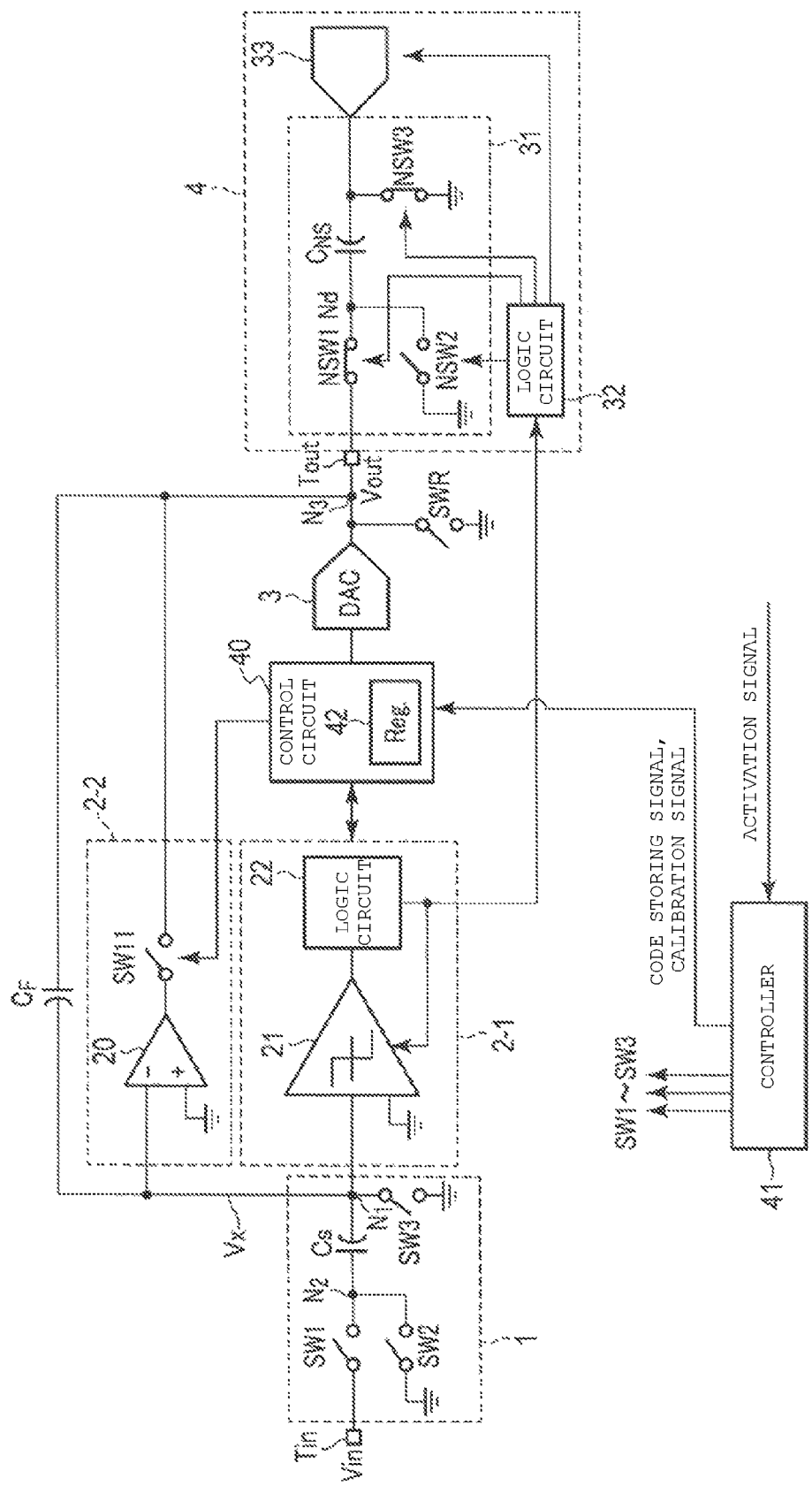
FIG. 1 is a diagram illustrating a configuration of an amplifier circuit according to a first embodiment.

FIG. 1 is a diagram illustrating the configuration of an amplifier circuit according to a first embodiment.

When an input voltage Vin is input at an input terminal Tin, the amplifier circuit according to the first embodiment amplifies the input voltage Vin at a predetermined amplification ratio and outputs an amplified voltage as an output voltage Vout at an output terminal Tout. This amplifier circuit has two operation phases, a sampling phase in which the input voltage Vin is sampled and an amplification phase in which the sampled input voltage Vin is amplified.

In the first embodiment, the amplification phase includes an offset cancellation phase for cancelling a difference (relative offset) between an offset of an operational amplifier 20 and an offset of a comparator 21. In the first embodiment, in the offset cancellation phase, the control circuit 40 outputs a cancellation digital code for cancelling the relative offset between the operational amplifier 20 and the comparator 21 to a DAC 3. The DAC 3 can output an analog signal in accordance with the cancellation digital code. The offset cancellation phase will be described in detail below.

As illustrated in the FIG. 1, the amplifier circuit includes a sampling circuit 1, a quantizer 2-1, an amplification unit 2-2, the DA converter (DAC) 3, a feedback capacitor $C_F$, a reset switch SWR, the control circuit 40, and a controller 41.

An analog to digital converter (ADC) 4 is connected to the output terminal Tout of the DAC 3. The ADC 4 includes a rear-stage sampling circuit 31, a logic circuit 32, and a quantizer 33. In FIG. 1, the sampling circuit 1 and the rear-stage sampling circuit 31 are switched capacitor circuits, but embodiments are not limited to the switched capacitor circuits as such are illustrated in FIG. 1.

In the sampling circuit 1, an input terminal is connected to the input terminal Tin of the amplifier circuit and the output terminal Tout is connected to a node $N_1$. The node $N_1$ is a connection point between the quantizer 2-1 and the feedback capacitor $C_F$. That is, the sampling circuit 1 is connected between the input terminal Tin and the quantizer 2-1. The input voltage Vin is input to the sampling circuit 1, and the sampling circuit 1 outputs a voltage $V_X$.

The sampling circuit 1 is a switched capacitor circuit that includes switches SW1 to SW3 and a sampling capacitor $C_S$. Here, opening and closing of the switches SW1 to SW3 are controlled by the controller 41.

The switch SW1 has a first end connected to the input terminal Tin and a second end connected to a node $N_2$. The node $N_2$ is a connection point between the switches SW1 and SW2 and the sampling capacitor $C_S$. The first end of the switch SW1 serves as an input terminal of the sampling circuit 1.

The switch SW2 has a first end connected to the node $N_2$ and a second end grounded. A ground voltage is assumed to be Vcm (here Vcm=0).

The switch SW3 has a first end connected to the node $N_1$ and a second end grounded. The sampling capacitor $C_S$ has one end connected to the node $N_2$ and another end connected to the node $N_1$. A connection point (node $N_1$) between the switch SW3 and the sampling capacitor $C_S$ serves as an output terminal of the sampling circuit 1.

In the sampling circuit 1 depicted in FIG. 1, the switches SW1 and SW3 are turned on and the switch SW2 is turned off during the sampling phase. Thus, the input voltage Vin is sampled by the sampling capacitor $C_S$. At this time, the voltage $V_X$ is 0.

In the sampling circuit 1 depicted in FIG. 1, the switches SW1 and SW3 are turned off and the switch SW2 is turned on during the amplification phase. This causes the voltage $V_X$ to be held by the sampling capacitor $C_S$ at −Vin.

In this example, the quantizer 2-1 is a successive approximation ADC (SAR-ADC). In the amplification phase, the quantizer 2-1 performs 1-bit quantization over a plurality of cycles to generate a digital code D. As illustrated in FIG. 1, the quantizer 2-1 includes a comparator 21 and a logic circuit 22.

The amplification unit 2-2 includes an operational amplifier 20 and a switch SW11. The quantizer 2-1 and the amplification unit 2-2 operate during the amplification phase including the offset cancellation phase of the amplifier circuit.

One input terminal (the negative (−) input terminal) of the operational amplifier 20 is connected to the output terminal (the node $N_1$) of the sampling circuit 1, and the voltage $V_X$ is input to the negative input terminal of the operational amplifier 20. The other input terminal (the positive (+) input terminal) of the operational amplifier 20 is grounded so that the ground voltage Vcm (here Vcm=0) is input to the other input terminal of the operational amplifier 20. The switch SW11 is connected between the output of the operational amplifier 20 and a node $N_3$.

Here, the operational amplifier 20 is described as an example configuration, but the example embodiments are not limited thereto. For example, an analog amplifier, such as a ring amplifier, may be used in some embodiments.

For a first predetermined time in the amplification phase including the offset cancellation phase, the switch SW11 is turned on (closed) by the control circuit 40 and the operational amplifier 20 operates (a first amplification phase). During this time, the output voltage Vout is expressed by the following expression.

[Expression 1]

$$Vout = Vin\frac{C_S}{C_F} \qquad (1)$$

After the first predetermined time elapses, the switch SW11 is turned off (opened) by the control circuit 40. Then, the control circuit 40 instructs the quantizer 2-1 to start a successive approximation operation.

One input terminal of the comparator 21 (first comparator) is connected to the output terminal (the node $N_1$) of the sampling circuit 1, and the voltage $V_X$ is input to that input terminal of the comparator 21 (first comparator). The other input terminal of the comparator 21 is grounded so that the ground voltage Vcm is input to the other input terminal of the comparator 21. The comparator 21 compares $V_X$ to 0 (the voltage at its other input terminal) and outputs a digital value (0 or 1) in accordance with a comparison result. Thus, the comparator 21 thus operates as a 1-bit quantizer.

The logic circuit 22 is a control circuit that controls the comparator 21. The logic circuit 22 causes the comparator 21 to compare $V_X$ to 0 over a plurality of cycles in the amplification phase, generates the digital code D in accordance with a digital value obtained for each cycle, and outputs the digital code D to the control circuit 40. The control circuit 40 outputs the digital code D from the logic circuit 22 to the DAC 3. Thus, the logic circuit 22 controls the comparator 21 such that the successive approximation operation of the quantizer 2-1 (SAR-ADC) is realized.

The controller 41 controls the switches SW1 to SW3 to sample the input voltage Vin. When an activation signal for the amplifier circuit is received, the controller 41 outputs a code storing signal to the control circuit 40. After the sampling phase ends, the controller 41 outputs a calibration signal that defines a processing timing of input signal to the control circuit 40.

The control circuit 40 receives the code storing signal and the calibration signal output from the controller 41 and controls the switch SW11, the quantizer 2-1, and the DAC 3 based on the received code storing signal and calibration signal. The control circuit 40 includes a register 42, which stores the cancellation digital code for cancelling the relative offset between the operational amplifier 20 and the comparator 21. That is, according to the first embodiment, since the relative offset between the operational amplifier 20 and the comparator 21 is output from the comparator 21, the logic circuit 22 can specify the cancellation digital code for cancelling the relative offset.

Figure 2:
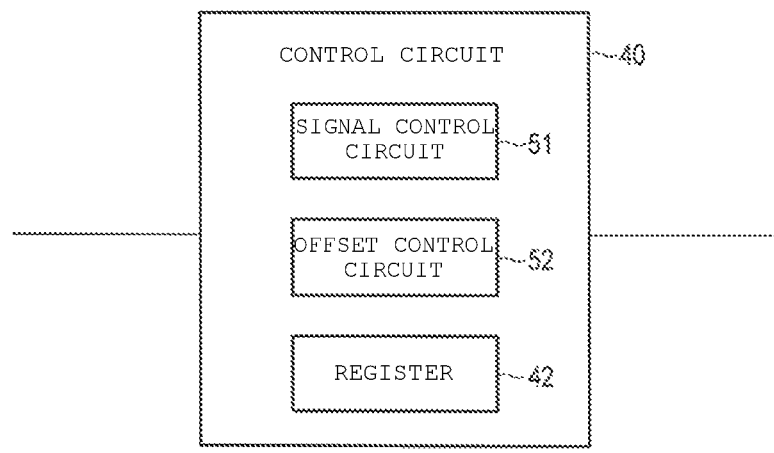
FIG. 2 is a block diagram illustrating a configuration of a control circuit in an example.

FIG. 2 is a block diagram illustrating the configuration of the control circuit 40. In FIG. 2, a signal control circuit 51 outputs the digital code of the input signals (the input signal+the relative offset between the operational amplifier 20 and the comparator 21) output from the quantizer 2-1 to the DAC 3. When the calibration signal is received from the controller 41, an offset control circuit 52 outputs the cancellation digital code stored in register 42 to the DAC 3 while the input signal is being processed.

For DAC 3, as depicted in FIG. 1, an input terminal of DAC 3 is connected to the output terminal of the control circuit 40, and an output terminal of the DAC 3 is connected to the node $N_3$. The node $N_3$ is a connection point between the output terminal Tout and the feedback capacitor $C_F$. That is, the DAC 3 is connected between the control circuit 40 and the output terminal Tout. When the digital code output by the control circuit 40 is received by the DAC 3, the DAC 3 outputs an analog signal obtained by performing DA conversion on the received digital code.

Figure 3:
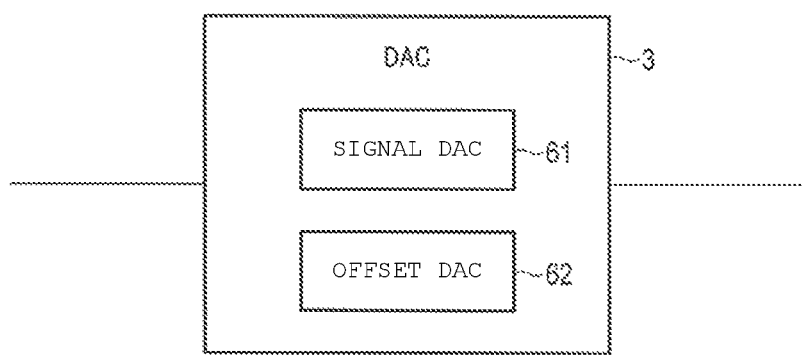
FIG. 3 is a block diagram illustrating a configuration of a digital-analog converter in an example.

FIG. 3 is a block diagram illustrating the configuration of the DAC 3. In the drawing, a signal DAC 61 outputs an analog signal according to the digital code of the received signals (the input signal+the relative offset between the operational amplifier 20 and the comparator 21) from the quantizer 2-1. An offset DAC 62 outputs an analog signal according to the cancellation digital code from the offset control circuit 52.

Figure 4:
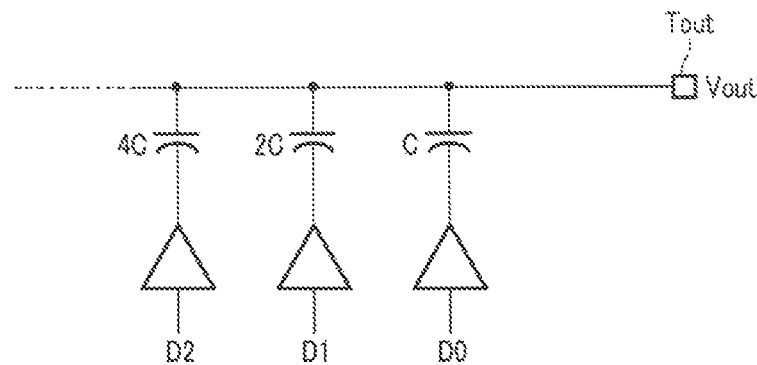
FIG. 4 is a diagram illustrating an example of a digital-analog converter.

FIG. 4 is a diagram illustrating a structural example of a DAC 3. The DAC 3 depicted in FIG. 4 is an N-bit capacitance DAC (DCC: Digital-Charge Converter) and outputs charge in accordance with the input digital code. As illustrated in FIG. 4, the DAC 3 includes N (three of which are specifically depicted) buffers to which bits (D0, D1, D2, . . . ) of the digital code are input and N capacitive elements (C, 2C, 4C, . . . ) which are connected to the buffers in series. A charge $Q_{INJ}$ output by the DAC 3 depicted in FIG. 4 is given by the following expression.

[Expression 2]

$$Q_{INJ} = \sum_{n=0}^{N} 2^n C \times D_n \times Vref \quad (2)$$

In Expression (2), C is a capacitance value of a capacitive element corresponding to a minimum bit, Dn is an n-th bit value (0 or 1) of the digital code D, and Vref is a driving voltage of the buffer. The feedback capacitor $C_F$ is charged with the charge $Q_{INJ}$ output by the DAC 3 in FIG. 4. Thus, Vout=$Q_{INJ}/C_F$ is satisfied.

When a capacitance-type DAC in FIG. 4 is used as the DAC 3, both positive and negative charges can be output to the DAC 3 by using a tri-state buffer as the buffer or outputting an intermediate code (for example, 100, 011, or the like) during the sample phase.

Figure 5:
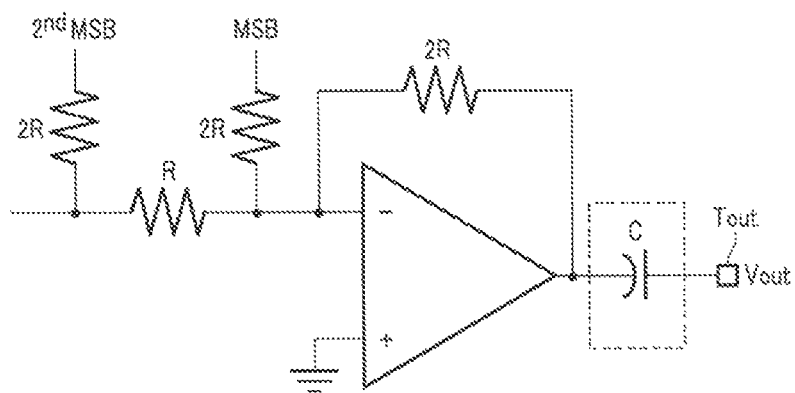
FIG. 5 is a diagram illustrating an example in which a capacitive element is connected between the digital-analog converter and an output terminal.

The DAC 3 is not limited to the capacitance-type DAC, and in some embodiments an R-2R resistor DAC or a ladder DAC may be used instead. When an R-2R resistor DAC or a ladder DAC is used as the DAC 3, a capacitive element is preferably connected between the DAC 3 and the output terminal Tout, as illustrated in FIG. 5, to convert output impedance into high impedance.

Referring back to FIG. 1, the feedback capacitor $C_F$ is connected between the output terminal (the node $N_1$) of the sampling circuit 1 and the output terminal (the node $N_3$) of the DAC 3. The feedback capacitor $C_F$ forms a feedback circuit that connects the input terminal of the quantizer 2-1 to the output terminal (the node $N_3$) of the DAC 3. The feedback capacitor $C_F$ feeds the analog signal output by the DAC 3 to the voltage $V_X$ of the sampling circuit 1 in the amplification phase.

The reset switch SWR has one end connected to the output terminal (the node $N_3$) and the other end grounded. The reset switch SWR is turned on (closed) in the sampling phase and is turned off (opened) in the amplification phase. When the reset switch SWR is turned on, charge in the feedback capacitor $C_F$ is removed.

When a conversion end signal is received from logic circuit 22, the logic circuit 32 controls switches NSW1 to NSW3 of the rear-stage sampling circuit 31 and the quantizer 33 of the ADC 4 such that an AD conversion operation is started. That is, the logic circuit 22 gives an instruction to start calculation(s) related to sampling by the rear-stage sampling circuit 31. The logic circuit 32 starts the instructed calculation when the instruction to start the calculation is received from the logic circuit 22.

The control of the sampling by the rear-stage sampling circuit 31 is the same as the sampling circuit 1. That is, the rear-stage sampling circuit 31 controls the switches NSW1 to NSW3 such that sampling control is performed. When the conversion end signal is received from the logic circuit 22, the logic circuit 32 controls the switches NSW1 to NSW3 such that the sampling ends. When the conversion end signal is received from the logic circuit 22, the logic circuit 32 controls the quantizer 33 such that the calculation related to the sampling capacitor sampled by the rear-stage sampling circuit 31 is started.

1-2 Operation

Next, an operation of the amplifier circuit according to the first embodiment will be described with reference to FIGS. 6 to 9. Hereinafter, the DAC 3 is assumed to be a capacitance DAC. However, as described above, the DAC 3 is not limited thereto.

1-2-1 Operation of Sampling Circuit 1

First, an operation of the sampling circuit 1 according to the first embodiment will be described.

In the sampling phase of the amplifier circuit according to the first embodiment, as described above, the switches SW1 and SW3 and the reset switch SWR are turned on, and the switch SW2 is turned off. Thus, in the sampling capacitor $C_S$, the input voltage Vin is sampled and a charge $QC_S$ is acquired.

1-2-2 Operation of Quantizer 2-1

In the amplification phase, the switches SW1 and SW3 and the reset switch SWR are turned off and the switch SW2 is turned on by the controller 41. Thus, the voltage $V_X$ is held in accordance with the input voltage Vin. The logic circuit 22 is activated to perform the successive approximation operation of N cycles.

Figure 6:
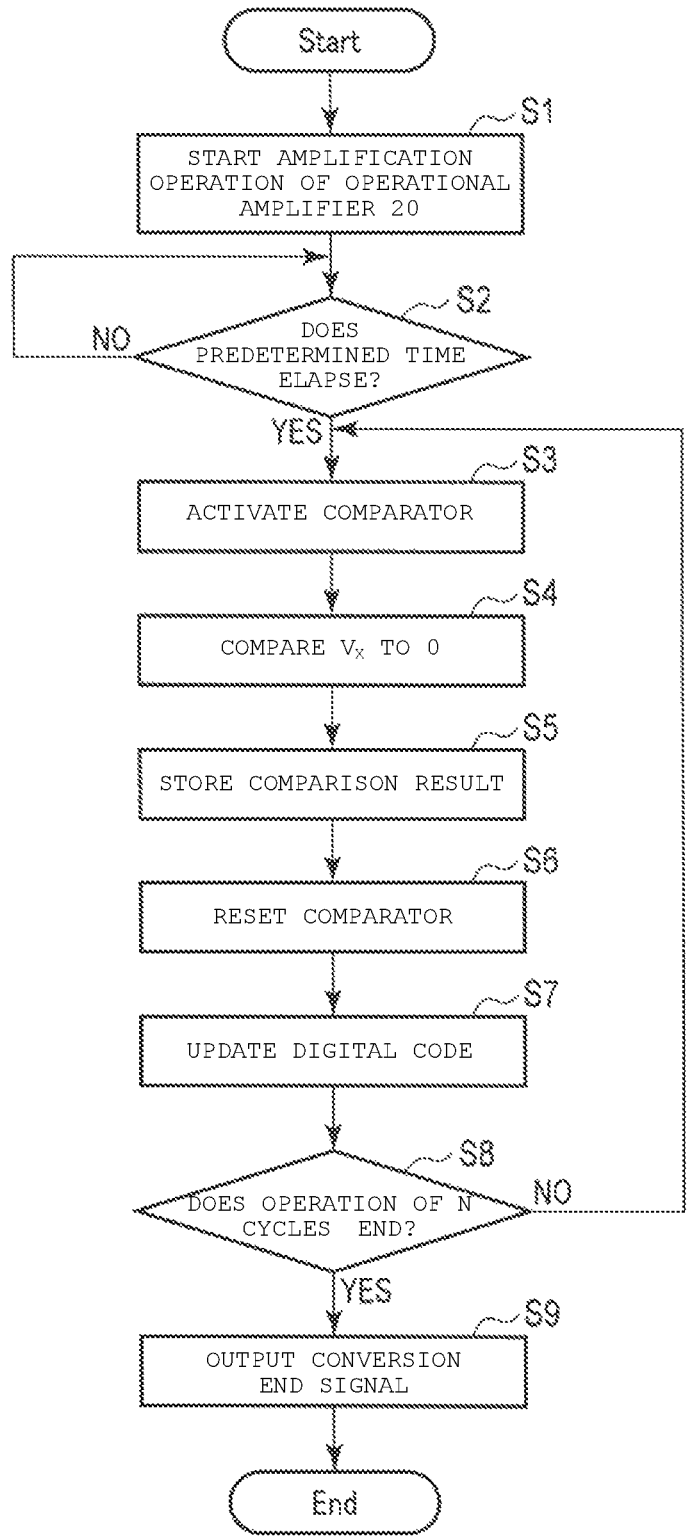
FIG. 6 is a flowchart illustrating a quantization operation of a quantizer in an amplification phase of the amplifier circuit according to the first embodiment.

FIG. 6 is a flowchart illustrating the operation of the quantizer 2-1 during an amplification phase of the amplifier circuit according to the first embodiment. First, when the amplification phase starts, the control circuit 40 turns on the switch SW11 to start the amplification operation of the operational amplifier 20 (step S1). Thereafter, it is determined whether a predetermined time has elapsed after the switch SW11 has been turned on (step S2). When it is determined that the predetermined time has elapsed (YES in step S2), the control circuit 40 turns off the switch SW11 and the logic circuit 22 activates the comparator 21 (step S3).

Next, the activated comparator 21 compares $V_X$ to 0 and outputs a digital value in accordance with a comparison result (step S4). Hereinafter, it is assumed that the comparator 21 outputs 1 when $V_X$ is greater than 0, and outputs 0 when $V_X$ is less than 0.

The comparison result (digital value) output by the comparator 21 is stored in the logic circuit 22 (step S5).

When the comparison result is stored, the logic circuit 22 resets the comparator 21 (step S6). That is, the logic circuit 22 ends the comparison operation by the comparator 21 and returns the comparator to the state before the activation.

Then, based on the stored comparison result, the logic circuit 22 updates the digital code D to be input to the DAC 3 (step S7). The logic circuit 22 updates the digital code D so that $V_X$ will be close to 0. Specifically, when 1 is input as the comparison result, the logic circuit 22 updates the digital code D so that the digital code D decreases. When 0 is input as the comparison result, the logic circuit 22 updates the digital code D so that the digital code D increases.

Thereafter, the logic circuit 22 determines whether a successive approximation operation of N cycles has ended (step S8). If the successive approximation operation of N cycles is finished (YES in step S8), the amplification phase ends. That is, when the amplification in the successive approximation operation of the amplifier circuit ends, the logic circuit 22 outputs a conversion end signal to the logic circuit 32 in a case in which the successive approximation operation ends even before a predetermined amplification period decided by a clock CLK ends. Thereafter, the sampling circuit 1 starts the sampling phase again based on the clock CLK. Conversely, if the successive approximation operation of N cycles is not finished (NO in step S8), the logic circuit 22 starts a subsequent cycle of the successive approximation operation and activates the comparator 21 again (step S3).

The clocks CLK supplied to the sampling circuit 1, the quantizer 2-1, the DAC 3, and the ADC 4 are not necessarily identical clock CLKs and in some embodiments may be separate clock signals with different timing/frequencies.

Figure 7:
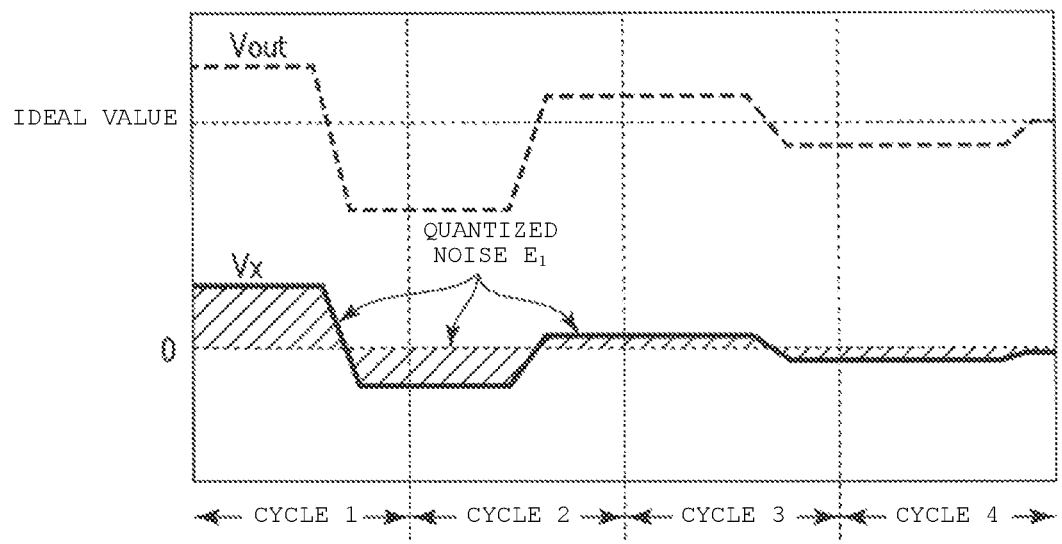
FIG. 7 is a diagram illustrating an output voltage of the quantizer of an example in the amplification phase.
Figure 8:
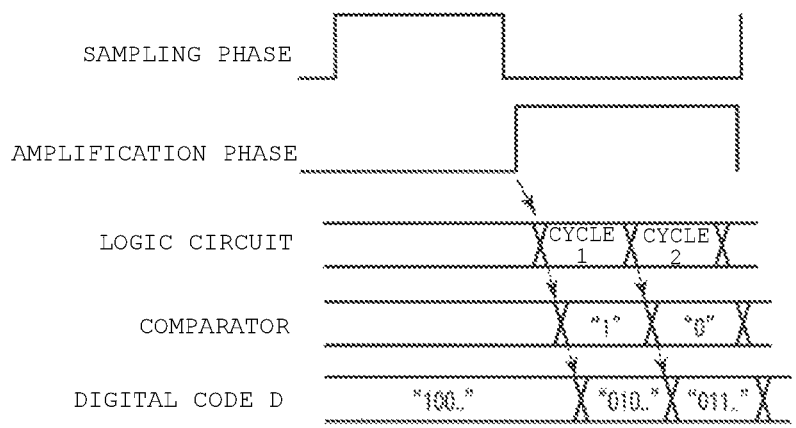
FIG. 8 is a timing chart illustrating an operation of the quantizer.

FIG. 7 is a diagram illustrating an output voltage of the quantizer 2-1 in the amplification phase. FIG. 8 is a timing chart illustrating an operation of the quantizer 2-1.

As illustrated in FIG. 7, when the voltage $V_X$ is greater than 0 at the beginning of the amplification phase, the comparator 21 outputs logic value "1" in cycle 1 (the approximation in the first cycle), as illustrated in FIG. 8. Then, the logic circuit 22, to which "1" is sent, updates the digital code D so that the digital code D decreases.

As illustrated in FIG. 8, when the digital code D (reset value) is 100 . . . at the beginning of the amplification phase, the logic circuit 22 changes the first bit (MSB) to "0" and the second bit to "1." Thus, the digital code D is updated from 100 . . . to 010 . . . .

When the digital code D is updated, the DAC 3 outputs charge according to the updated digital code D. When the digital code D is decreased, the DAC 3 outputs a charge so that the output voltage Vout decreases. That is, charge is extracted from the feedback capacitor $C_F$.

Thus, as illustrated in FIG. 7, the output voltage Vout decreases. As a result, the voltage $V_X$ also decreases. Thereafter, the comparator 21 is reset and cycle 1 ends.

When cycle 1 ends, cycle 2 (the approximation operation of the second cycle) starts. Since $V_X$ is less than 0 at cycle 1, as illustrated in FIG. 7, the comparator 21 outputs "0" in cycle 2. Then, the logic circuit 22 to which "0" is sent updates the digital code D so that the digital code D increases.

As the digital code D became 010 . . . at the end of cycle 1, the logic circuit 22 changes the third bit to "1." Thus, the digital code D is updated from 010 . . . to 011 . . . .

When the digital code D is updated, the DAC 3 outputs a charge according to the updated digital code D. When the digital code D is increased, the DAC 3 outputs a charge so that output voltage Vout increases. That is, charge is added to the feedback capacitor $C_F$.

Thus, as illustrated in FIG. 7, the output voltage Vout increases. As a result, the voltage $V_X$ also increases. Thereafter, the comparator 21 is reset and cycle 2 ends.

Thereafter, the same cycle is repeated up to N cycles. As illustrated in FIG. 7, the voltage $V_X$ is closer to 0 and a quantization error E1 decreases whenever the approximation operation is repeated. As a result, the output voltage Vout is closer to an ideal value and amplification precision of the amplifier circuit is improved.

1-2-3 Operation of Logic Circuit 32

Figure 9:
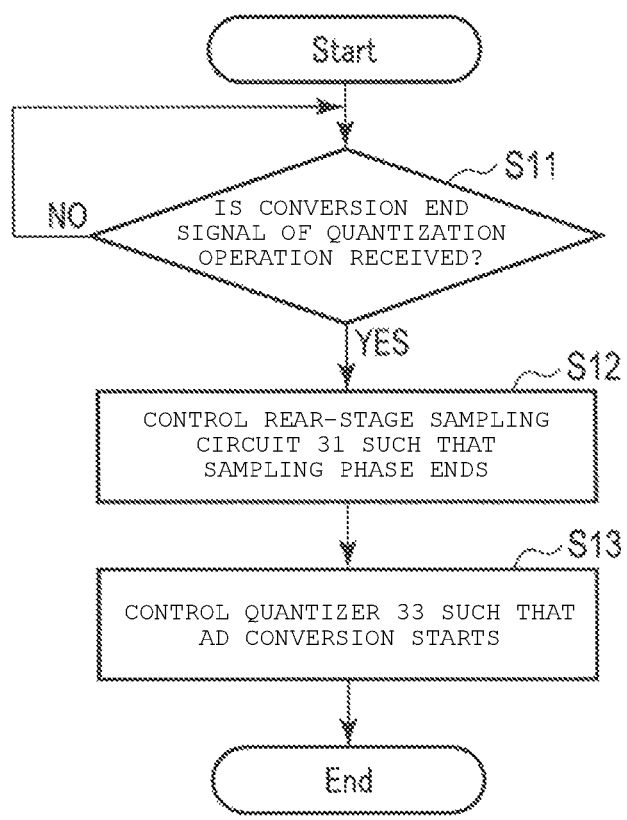
FIG. 9 is a flowchart illustrating an operation of a logic circuit of an example.

FIG. 9 is a flowchart illustrating an operation of the logic circuit 32.

When the conversion end signal is received from the logic circuit 22 (YES in step S11), the logic circuit 32 controls the switches NSW1 to NSW3 of the rear-stage sampling circuit 31 and ends the sampling phase (step S12).

Then, the quantizer 33 is controlled such that quantization of the voltage sampled by the rear-stage sampling circuit 31 starts in the amplification phase (step S13).

1-2-4 Operation at Time of Activation of Amplifier Circuit

Next, an operation at the time of activation of the amplifier circuit according to the first embodiment will be described with reference to the flowchart of FIG. 10. FIG. 11 is a diagram illustrating an output voltage at the time of activation of the amplifier circuit according to the first embodiment.

Figure 10:
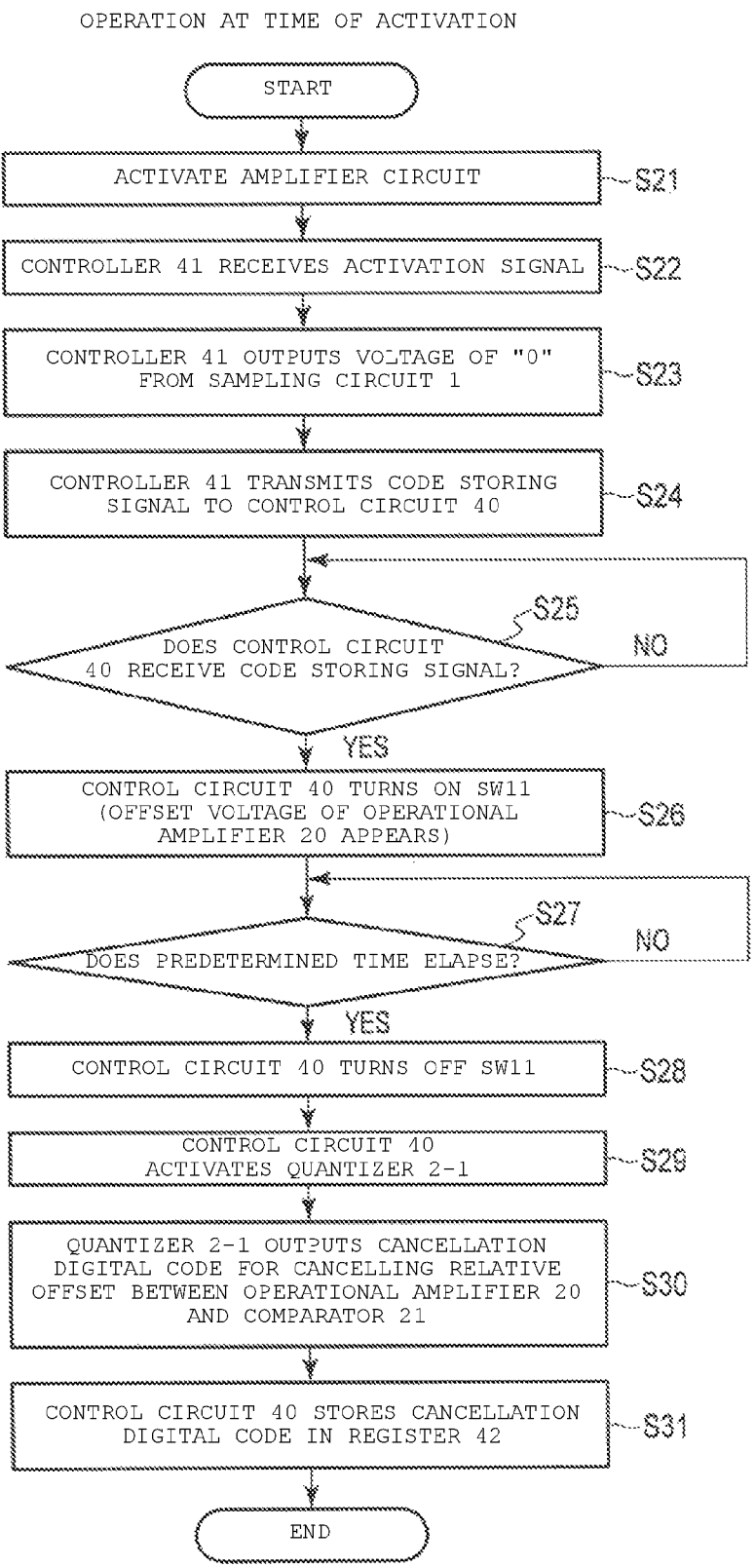
FIG. 10 is a flowchart illustrating an operation at the time of activation of the amplifier circuit according to an embodiment.
Figure 11:
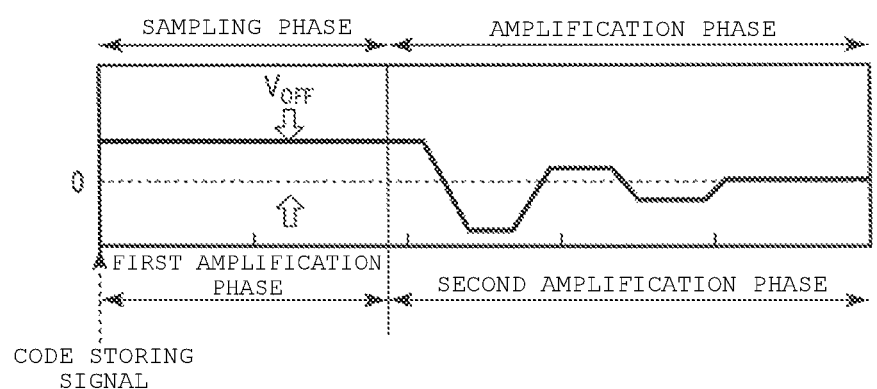
FIG. 11 is a diagram illustrating an output voltage at the time of activation of the amplifier circuit according to the first embodiment.

As illustrated in FIG. 10, when the amplifier circuit of the first embodiment is activated (step S21), the controller 41 receives an activation signal (step S22). When the controller 41 receives the activation signal, the controller 41 controls the switches SW1 to SW3 of the sampling circuit 1 such that a voltage of "0" is output (step S23).

Specifically, the controller 41 turns off the switch SW1 and turns on the switches SW2 and SW3 and outputs the voltage of "0" from the sampling circuit 1. The configuration of the sampling circuit 1 is not limited to the configuration illustrated in FIG. 1, but another configuration may be used. The input voltage is not limited to the voltage of "0", but any voltage by which an offset voltage of the operational amplifier 20 can be measured may be used.

Next, the controller 41 transmits the code storing signal to the control circuit 40 (step S24). The control circuit 40 determines whether the control circuit 40 receives the code storing signal from the controller 41 (step S25). When the control circuit 40 determines in step S25 that the control circuit 40 receives the code storing signal (YES in step S25), the control circuit 40 turns on the switch SW11 (step S26). Thus, the offset voltage ($V_{OFF}$ in FIG. 11) of the operational amplifier 20 appears in the node $N_1$.

Thereafter, it is determined whether a predetermined time has elapsed after the switch SW11 is turned on (step S27). When it is determined that the predetermined time has elapsed (YES in step S27), the control circuit 40 turns off the switch SW11 (step S28).

Next, the control circuit 40 activates the quantizer 2-1 (step S29). The logic circuit 22 of the quantizer 2-1 outputs the cancellation digital code for cancelling the relative offset between the operational amplifier 20 and the comparator 21 (step S30). The control circuit 40 stores the cancellation digital code output from the quantizer 2-1 in the register 42 (step S31).

1-2-5 Operation at Time of Signal Processing of Amplifier Circuit

Next, an operation at the time of signal processing of the amplifier circuit according to the first embodiment will be described with reference to the flowchart of FIG. 12.

Figure 13:
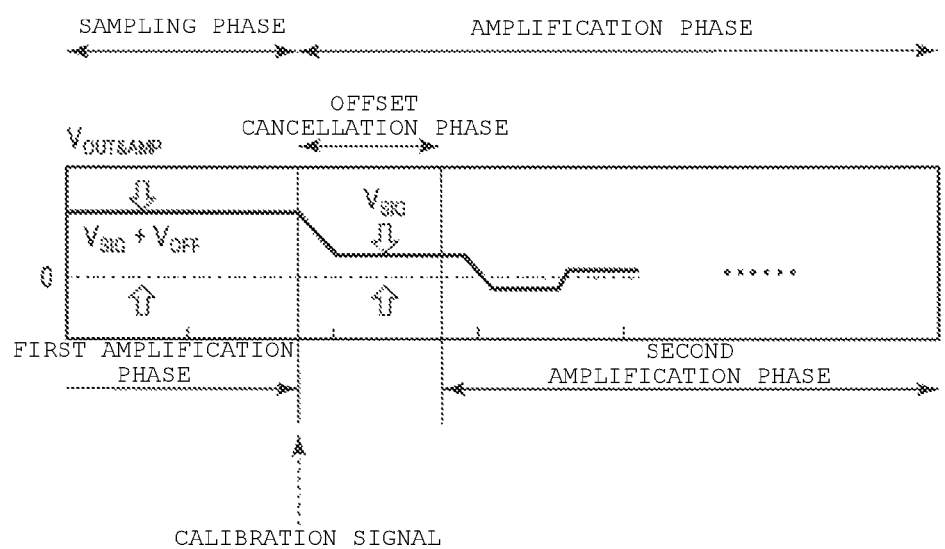
FIG. 13 is a diagram illustrating an output voltage at the time of activation of the amplifier circuit according to the first embodiment.

FIG. 13 is a diagram illustrating an output voltage at the time of activation of the amplifier circuit according to the first embodiment.

Figure 12:
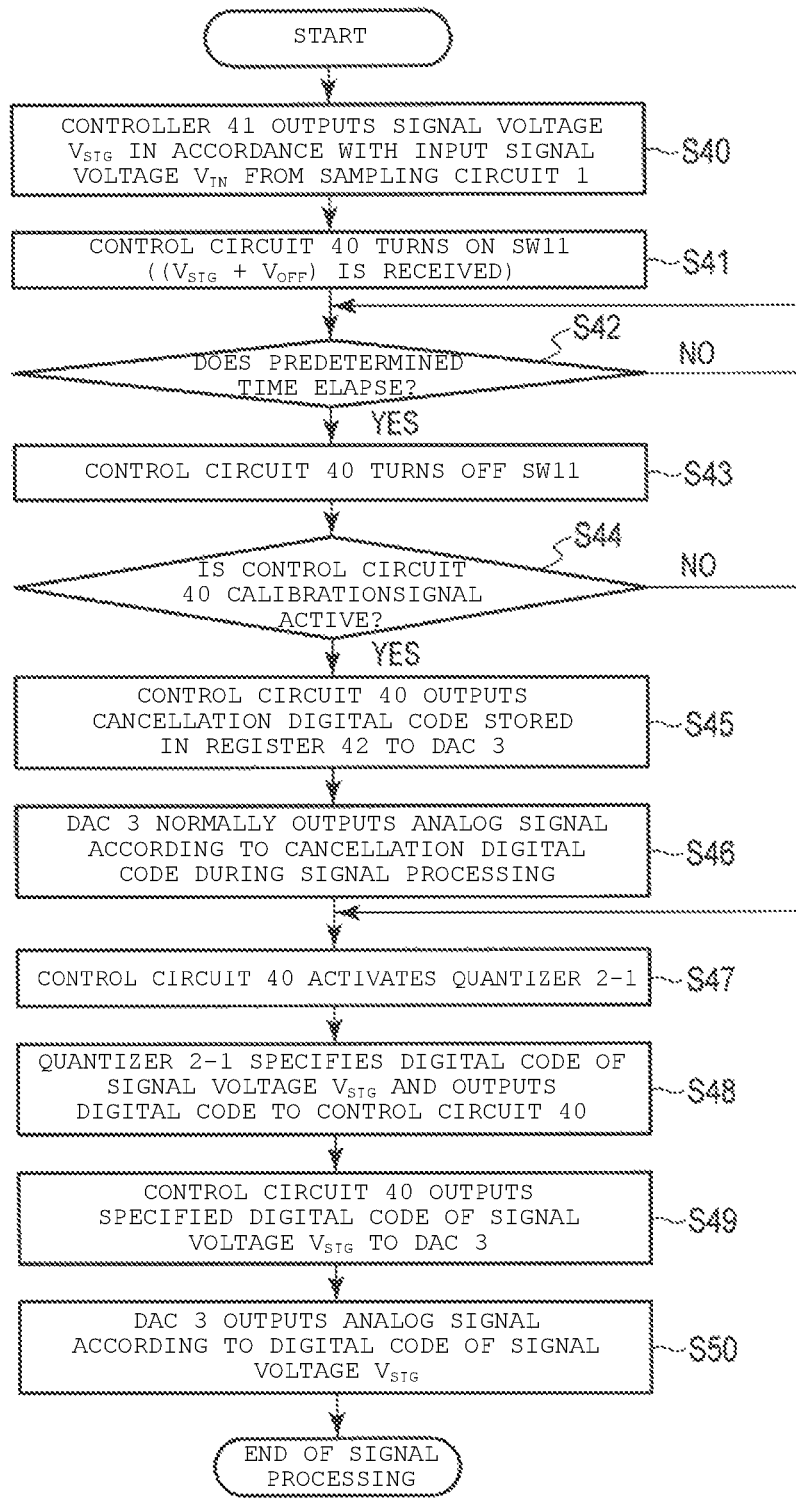
FIG. 12 is a flowchart illustrating an operation at the time of signal processing of the amplifier circuit according to the first embodiment.

As illustrated in FIG. 12, at the time of signal processing of the amplifier circuit, the controller 41 outputs a signal voltage $V_{SIG}$ in accordance with the input signal $V_{in}$ from the sampling circuit 1 (step S40). Next, the control circuit 40 turns on the switch SW11 (step S41). Thus, the signal voltage $V_{SIG}$+the offset voltage $V_{OFF}$ of the operational amplifier 20 appears in the node $N_1$ ($V_{SIG}$+$V_{OFF}$ in FIG. 13).

Next, it is determined whether a predetermined time elapses after the switch SW11 is turned on (step S42). When it is determined that the predetermined time elapses (YES in step S42), the control circuit 40 turns off the switch SW11 (step S43).

Next, the control circuit 40 determines whether the calibration signal is received from the controller 41 (step S44). If it is determined that the calibration signal is active (YES in step S44), the control circuit 40 outputs the cancellation digital code stored in the register 42 to the DAC 3 (step S45). Conversely, if it is determined that the calibration signal is not active (NO in step S44), the process proceeds to step S47.

The DAC 3 outputs the analog signal according to the cancellation digital code during the signal processing (step S46). Thus, the offset voltage ($V_{OFF}$ in FIG. 11) of the operational amplifier 20 is cancelled and the signal voltage $V_{SIG}$ appears in the node $N_1$ (the signal voltage $V_{SIG}$ in the offset cancellation phase in FIG. 13).

Next, the control circuit 40 activates the quantizer 2-1 (step S47). The quantizer 2-1 specifies the digital code of the signal voltage $V_{SIG}$ and outputs the specified digital code to the control circuit 40 (step S48).

The control circuit 40 outputs the specified digital code of the signal voltage $V_{SIG}$ output from the quantizer 2-1 to the DAC 3 (step S49). The DAC 3 outputs the analog signal according to the specified digital code of the signal voltage $V_{SIG}$ output from the control circuit 40 (step S50). Thus, the signal processing ends.

1-3 Advantages
1-3-1 Advantage of Cancelling Relative Offset

Figure 14:
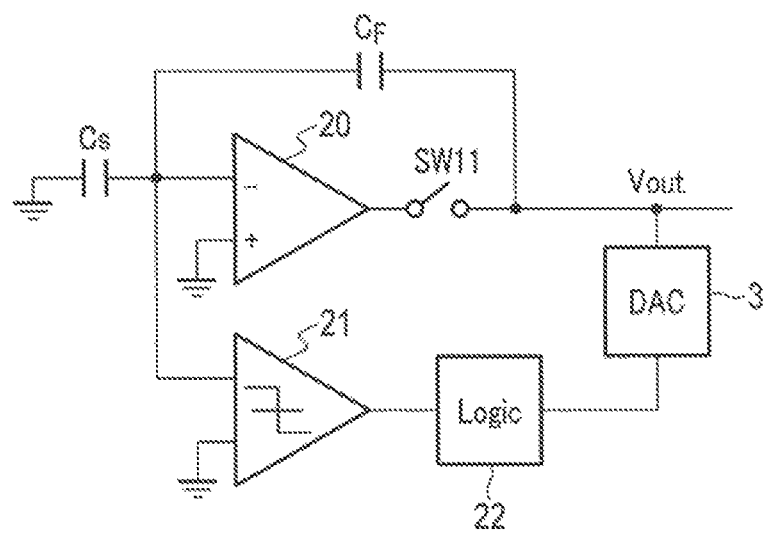
FIG. 14 is a diagram illustrating a configuration of a digital amplifier according to a comparative example.
Figure 15:
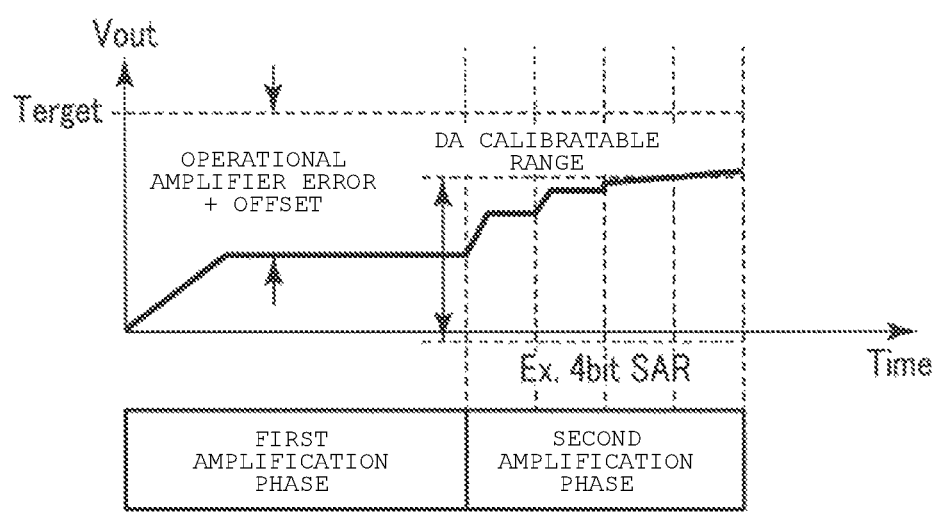
FIG. 15 is a diagram illustrating an operation of the digital amplifier according to the comparative example.

FIG. 14 is a diagram illustrating the configuration of a digital amplifier according to a comparative example. FIG. 15 is a diagram illustrating an operation of the digital amplifier according to the comparative example.

In the digital amplifier according to the comparative example depicted in FIG. 14, the occupied circuit area of the capacitance-type DAC 3 element may be increased when the number of bits of this capacitance-type DAC 3 is increased in order to expand a configurable range (see FIG. 15) of the offsets of the operational amplifier 20 and the comparator 21. Also, a conversion speed may decrease with an increase of a successive approximation register (SAR) cycle.

However, according to the first embodiment, the relative offset between the comparator 21 and the operational amplifier 20 can be removed by the DAC 3. Therefore, any error in signal processing is an "operational amplifier error" from the operational amplifier 20 caused due to a signal. Accordingly, the amplifier circuit according to the first embodiment can achieve the amplification with high precision.

Since it is not necessary to increase the number of bits of the DAC 3, the area of the amplifier circuit does not have to be increased to improve amplification performance/precision. Furthermore, since it is not necessary to increase the SAR cycle, the conversion speed will not be decreased.

2 Second Embodiment 2-1 Configuration

Figure 16:
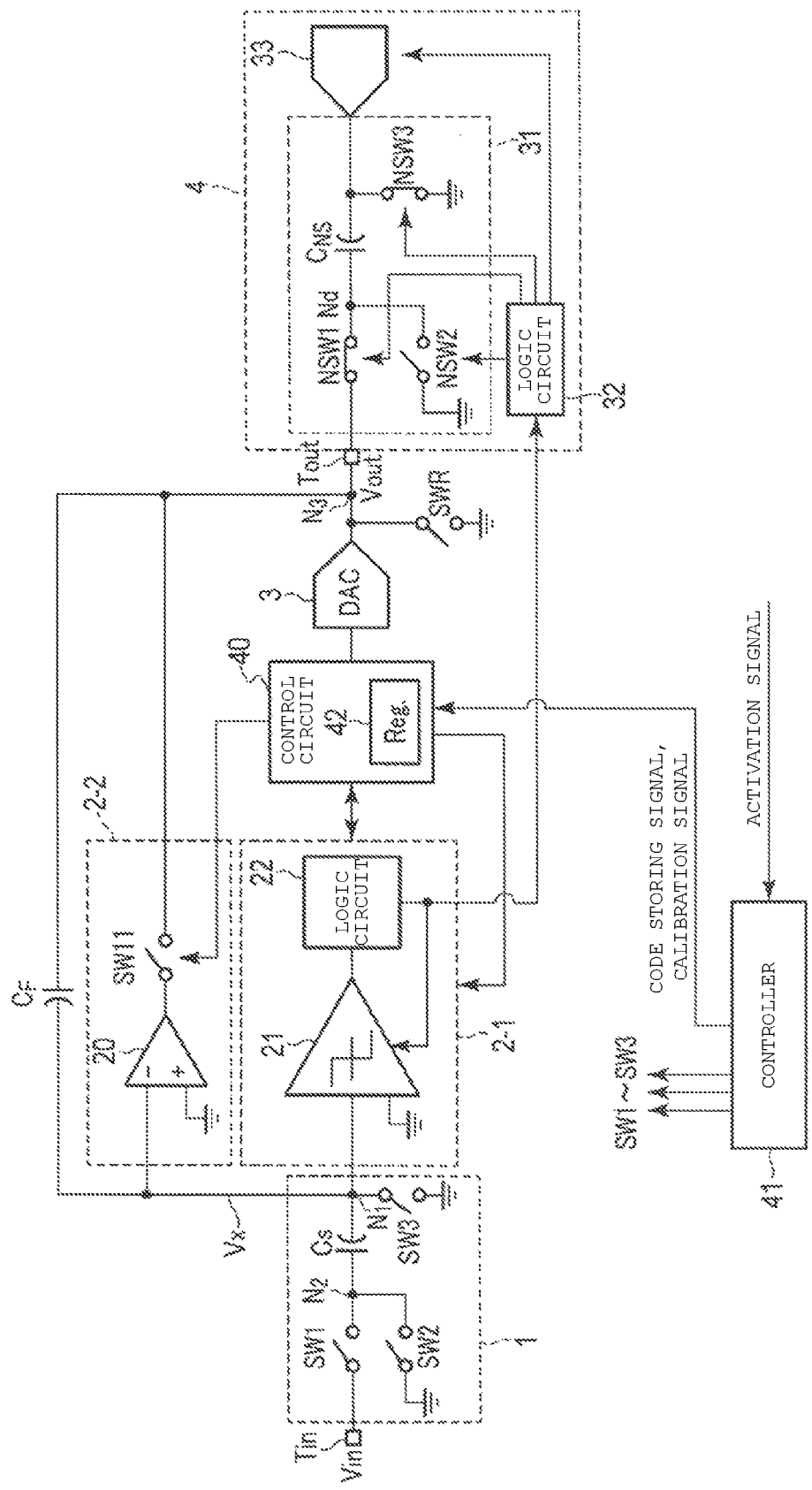
FIG. 16 is a diagram illustrating a configuration of an amplifier circuit according to a second embodiment.

FIG. 16 is a diagram illustrating the configuration of an amplifier circuit according to a second embodiment.

The amplifier circuit of the second embodiment is different from the amplifier circuit of the first embodiment in that the control circuit 40 does not output the cancellation digital code to the DAC 3, but rather outputs the cancellation digital code to the quantizer 2-1.

The quantizer 2-1 can change a quantization level according to the cancellation digital code output from the control circuit 40. Here, the "quantization level" is an analog level used for determining when an analog voltage input to the quantizer 2-1 is converted into a digital code.

When changing the quantization level, the analog level used for determination is changed so that an analog voltage output from the DAC 3 is corresponding to a relative offset voltage between the operational amplifier 20 and the comparator 21 is removed.

2-2 Operation

Figure 17:
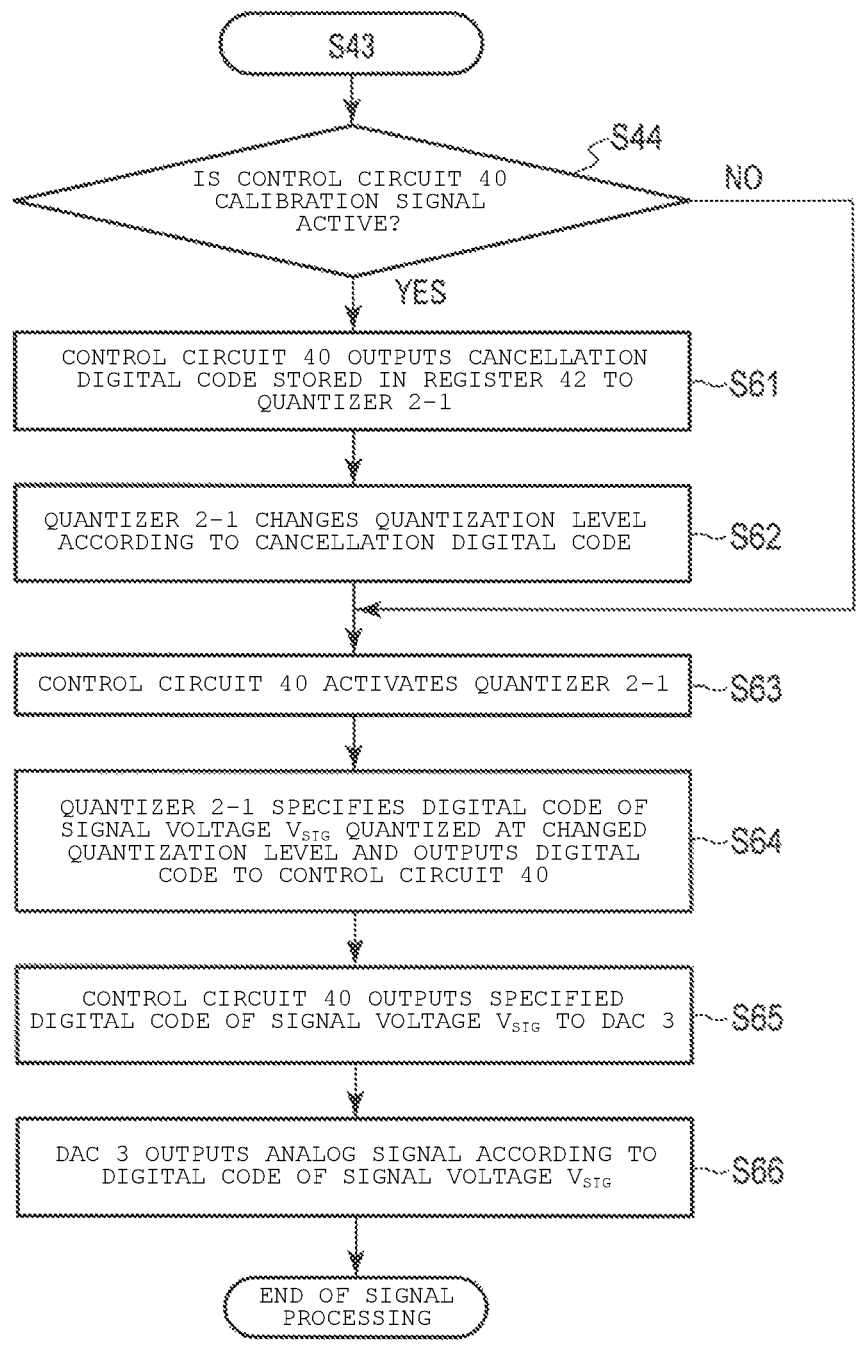
FIG. 17 is a flowchart illustrating an operation of signal processing of the amplifier circuit according to the second embodiment.

Next, an operation of the signal processing of the amplifier circuit according to the second embodiment will be described with reference to the flowchart of FIG. 17. The operation at the time of activation is the same as the operation illustrated in FIG. 10 according to the first embodiment.

The processes from steps S40 to S44 are the same as the processes described in the first embodiment, and thus these processes will not be described. In step S44, the control circuit 40 determines whether the calibration signal is received from the controller 41. When it is determined that the calibration signal is active (YES in step S44), the control circuit 40 outputs the cancellation digital code stored in the register 42 to the quantizer 2-1 (step S61). Conversely, when it is determined that the calibration signal is not active (NO in step S44), the process proceeds to step S63.

Next, the quantizer 2-1 changes the quantization level according to the cancellation digital code (step S62). Thereafter, the control circuit 40 activates the quantizer 2-1 (step S63). The quantizer 2-1 specifies the digital code of the signal voltage $V_{SIG}$ quantized at the changed quantization level and outputs the digital code to the control circuit 40 (step S64).

Next, the control circuit 40 outputs the specified digital code of the signal voltage $V_{SIG}$ output from the quantizer 2-1 to the DAC 3 (step S65). The DAC 3 outputs the analog signal according to the specified digital code of the signal voltage $V_{SIG}$ output from the control circuit 40 (step S66). Thus, the signal processing ends.

2-3 Advantages

In the amplifier circuit according to the second embodiment, the quantizer 2-1 can remove the relative offset between the comparator 21 and the operational amplifier 20. Therefore, error in the signal processing is the "operational amplifier error" of the operational amplifier 20 caused due to a signal. Accordingly, the amplifier circuit according to the second embodiment can achieve high precision amplification.

3 Third Embodiment

3-1 Configuration

Figure 18:
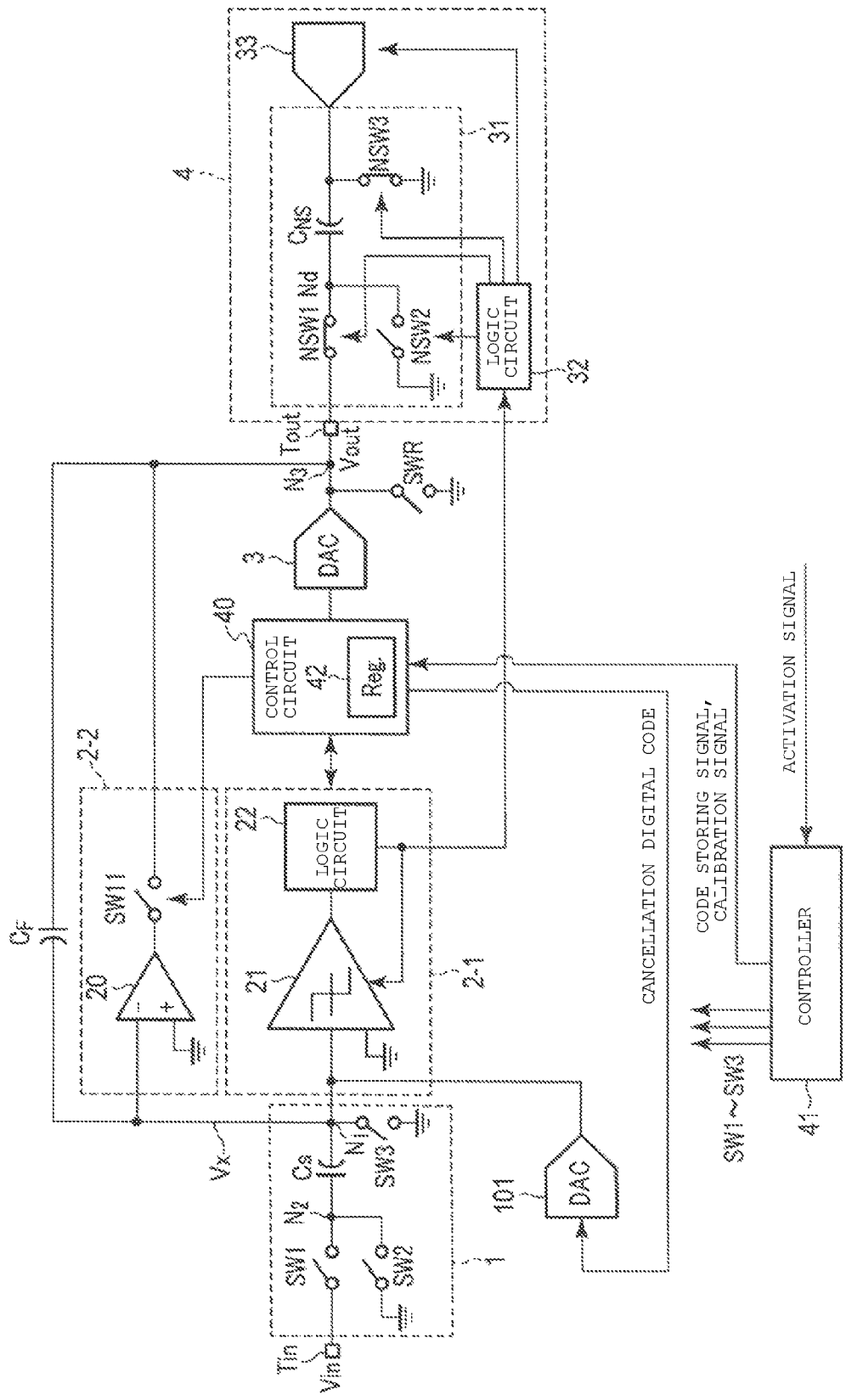
FIG. 18 is a diagram illustrating a configuration of an amplifier circuit according to a third embodiment.

FIG. 18 is a diagram illustrating the configuration of an amplifier circuit according to a third embodiment.

The amplifier circuit of the third embodiment is different from the amplifier circuit of the first embodiment in that that a DAC 101 is provided and the control circuit 40 does not output the cancellation digital code to the DAC 3, but rather outputs the cancellation digital code to the DAC 101.

The DAC 101 outputs an analog signal according to the cancellation digital code output from the control circuit 40 at the time of signal processing. The input of the DAC 101 is connected to an output of the control circuit 40, and the output of DAC 101 has the same potential as the node $N_1$ and is connected to an input terminal of the comparator 21.

3-2 Operation

Figure 19:
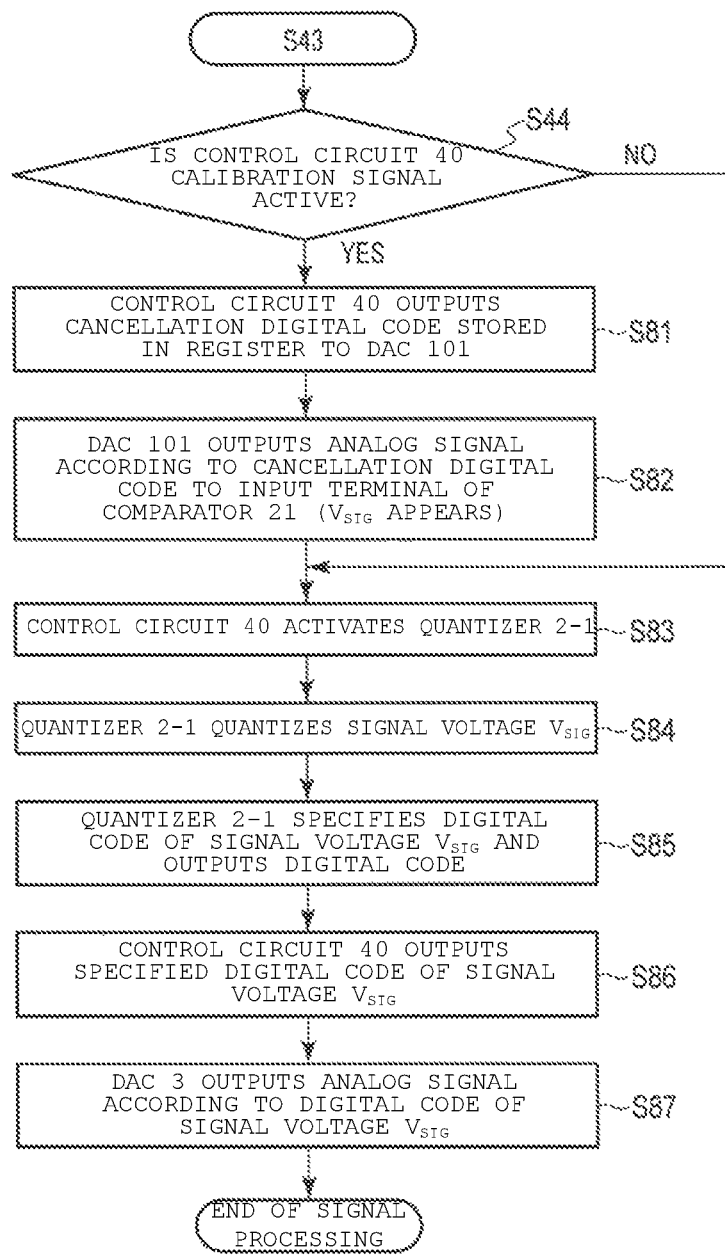
FIG. 19 is a flowchart illustrating an operation of signal processing of the amplifier circuit according to the third embodiment.

Next, an operation of the signal processing of the amplifier circuit according to the third embodiment will be described with reference to the flowchart of FIG. 19. The operation at the time of activation is the same as the operation illustrated in FIG. 10 according to the first embodiment.

The processes from steps S40 to S44 are the same as the processes described in the first embodiment, and thus these processes will not be described. In step S44, the control circuit 40 determines whether the calibration signal is received from the controller 41. When it is determined that the calibration signal is active (YES in step S44), the control circuit 40 outputs the cancellation digital code stored in the register 42 to the DAC 101 (step S81). Conversely, when it is determined that the calibration signal is not active (NO in step S44), the process proceeds to step S83.

Next, the DAC 101 outputs an analog signal (according to the cancellation digital code) to the input terminal of the comparator 21 (step S82). Thus, the signal voltage $V_{SIG}$ is supplied to the node $N_1$. Thereafter, the control circuit 40 activates the quantizer 2-1 (step S83). The quantizer 2-1 quantizes the signal voltage $V_{SIG}$ (step S84), specifies the digital code, and outputs the digital code to the control circuit 40 (step S85).

Next, the control circuit 40 outputs the specified digital code of the signal voltage $V_{SIG}$ output from the quantizer 2-1 to the DAC 3 (step S86). The DAC 3 outputs the analog signal according to the specified digital code of the signal voltage $V_{SIG}$ output from the control circuit 40 (step S87). Thus, the signal processing ends.

3-3 Advantages

In the amplifier circuit according to the third embodiment, the DAC 101 can remove the relative offset between the comparator 21 and the operational amplifier 20. Therefore, the error in the signal processing is the "operational amplifier error" of the operational amplifier caused due to a signal. Accordingly, the amplifier circuit according to the third embodiment can achieve high amplification precision.

In the third embodiment described above, the analog signal according to the cancellation digital code output from the DAC 101 is input to the comparator 21, but the analog signal may be input to the operational amplifier 20 in the sampling phase.

4-2 Another Switched Capacitor Circuit

Figure 20:
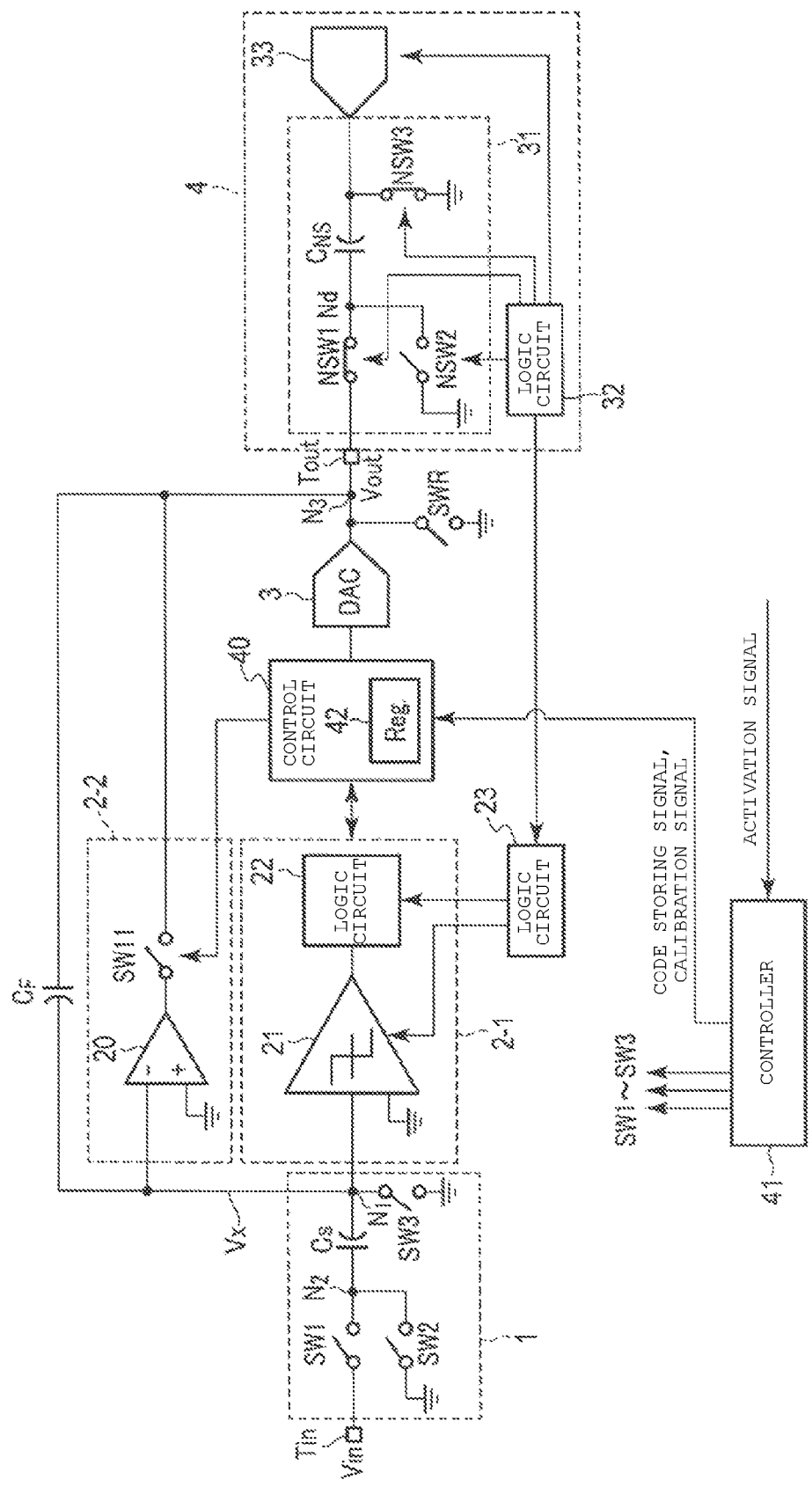
FIG. 20 is a diagram illustrating a configuration of an amplifier circuit including a logic circuit according to an embodiment.

FIG. 20 is a diagram illustrating a configuration of an amplifier circuit including a logic circuit 23 according to another embodiment In the above-described embodiments, an amplifier circuit has been described, but in some embodiments an integrator may be used.

According to the disclosure, by configuring an integrator using the amplifier circuit according to the first embodiment, the integrator operates at low power consumption. The integrator can be applied to, for example, a delta-sigma ADC.

4-3 Example of Another Quantizer 2-1

In the above-described embodiments, the quantizer 2-1 is configured to include the comparator 21 and the logic circuit 22, but the configuration of the quantizer 2-1 is not limited thereto.

Figure 21:
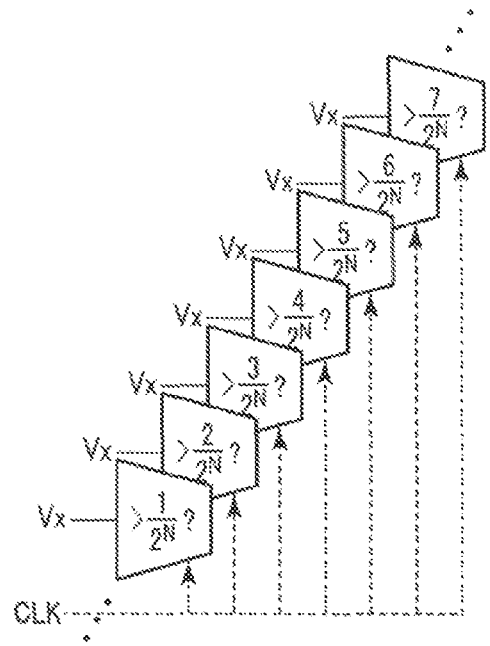
FIG. 21 is a diagram illustrating an example of a quantizer.

FIG. 21 is a diagram illustrating another structural example of the quantizer 2-1. The quantizer 2-1 depicted in FIG. 21 is an N-bit flash ADC and is configured with $2^N$ comparators connected in parallel. The voltage $V_X$ and a reference voltage corresponding to each bit are input to each comparator, and "0" or "1" is output according to a comparison result.

Thus, in various embodiments, the quantizer 2-1 may be a flash ADC, a pipeline ADC, or a delta-sigma ADC.

4-4 Example of Another Rear-Stage Circuit

In the above-described embodiments, as an example of a rear-stage circuit, an ADC 4 having a sampling circuit has been described. However, any rear-stage circuit including a sampling circuit may be used. For example, a rear-stage circuit may be a pipeline stage of the pipeline ADC 4. The pipeline stage is one of internal blocks of the pipeline ADC.

Figure 22:
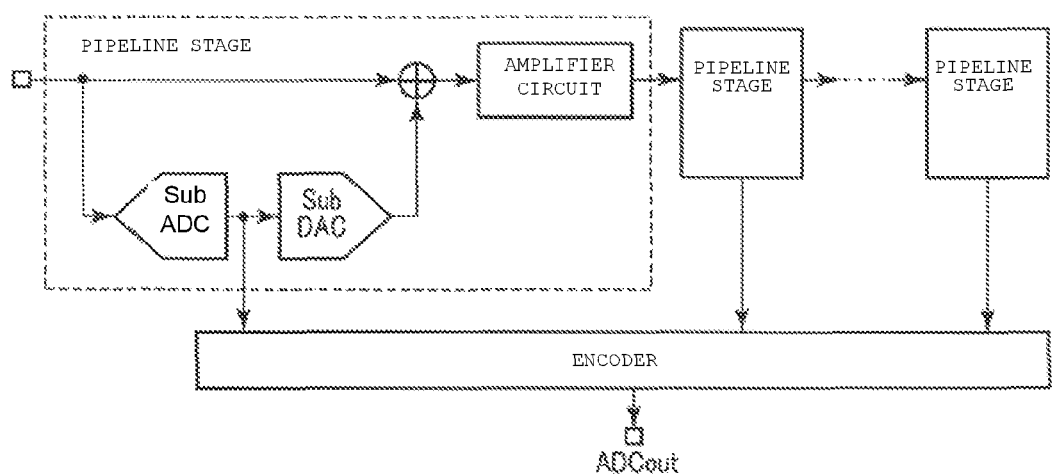
FIG. 22 is a diagram illustrating an example of a pipeline analog-to-digital converter.

FIG. 22 is a diagram illustrating an example of a pipeline ADC according to the embodiment. As illustrated in FIG. 22, the pipeline ADC includes a plurality of pipeline stages connected in series and an encoder that encodes an output signal of each pipeline stage and outputs a digital code $ADC_{out}$, which is an AD conversion result.

Each pipeline stage includes a sub-ADC, a sub-DAC, a residual calculation circuit (subtractor), and an amplifier circuit.

The sub-ADC performs AD conversion on an analog signal input to the pipeline stage and inputs an AD conversion result to the encoder and the sub-DAC. The sub-DAC performs DA conversion on the input AD conversion result and outputs an analog signal. The residual calculation circuit subtracts the analog signal output by the sub-DAC from the analog signal input to the pipeline stage and outputs a residual signal. The amplifier circuit amplifies the residual signal output by the residual calculation circuit and inputs the amplified residual signal to a subsequent pipeline stage.

The pipeline ADC according to this embodiment includes an amplifier circuit, as described according to anyone of the foregoing embodiments, as the amplifier circuit that amplifies the residual signal. In such a configuration, the AD conversion precision of the pipeline ADC is improved and low power consumption can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An amplifier circuit, comprising:
a sampling circuit configured to sample a voltage of an input signal;
an amplifier having an input terminal connected to an output terminal of the sampling circuit;
a feedback capacitor connected between an output terminal of the amplifier and the output terminal of the sampling circuit;
a quantizer including a comparator that has a first input terminal connected to the output terminal of the sampling circuit and a second input terminal connected to a reference potential terminal, the quantizer configured to quantize a voltage at the output terminal of the sampling circuit according to a comparison of the voltage at the output terminal of the sampling circuit to a voltage at the reference potential terminal and to output a digital code according to the comparison;
a control circuit receiving the digital code from the quantizer and including a register for storing the digital code as a cancellation digital code for cancelling a difference between an offset of the amplifier and an offset of the comparator; and
a first digital-analog (D/A) converter configured to output an analog signal in accordance with digital codes from the control circuit.

2. The amplifier circuit according to claim 1, wherein
the sampling circuit outputs an offset voltage for acquiring the cancellation digital code before the quantizer processes the input signal,
the quantizer quantizes the output offset voltage and outputs the cancellation digital code, and
the control circuit stores the cancellation digital code output from the quantizer in the register.

3. The amplifier circuit according to claim 1, wherein
the control circuit outputs the cancellation digital code stored in the register to the first D/A converter when a timing signal is received, and
the first D/A converter outputs the analog signal according to the cancellation digital code output from the control circuit while the input signal is being processed.

4. The amplifier circuit according to claim 1, wherein
the control circuit outputs the cancellation digital code stored in the register to the quantizer when a timing signal is received,
the quantizer can be operated at a plurality of quantization levels and a quantization level at which the quantizer operates to process the input signal can be altered according to the cancellation digital code.

5. The amplifier circuit according to claim 1, further comprising:
a second digital-analog (D/A) converter configured to generate an analog signal in accordance with the cancellation digital code, wherein
the analog signal generated by the second D/A converter is applied to the first input terminal of the comparator while the input signal is being processed.

6. The amplifier circuit according to claim 1, wherein the quantizer is a flash analog-to-digital converter (ADC).

7. The amplifier circuit according to claim 1, wherein the first D/A converter includes:
an output terminal that carries the analog signal output from the first D/A converter;
a plurality of buffers in which one buffer for each bit of the digital code is provided; and
a plurality of capacitors, each capacitor in the plurality of capacitors coupling one buffer in the plurality of buffers to the output terminal of the first D/A converter, wherein
a capacitance value for a capacitor in the plurality of capacitors that corresponds to a more significant bit in the digital code is twice a capacitance value of a capacitor in the plurality of capacitors that corresponds to a less significant bit that is adjacent to the more significant bit in the digital code.

8. The amplifier circuit according to claim 1, further comprising a coupling capacitor, wherein
the first D/A converter is a R-2R resistor DAC having an analog output that is coupled to an output terminal of the first D/A converter by the coupling capacitor.

9. The amplifier circuit according to claim 1, wherein
the comparator is configured to perform a plurality of comparisons of the voltage at the output terminal of the sampling circuit to the voltage at the reference potential terminal of the comparator, and
the voltage at the output terminal of the sampling circuit is altered after each comparison of the comparator.

10. The amplifier circuit according to claim 1, wherein the sampling circuit includes:
a first switch, a second switch, and a third switch; and
a sampling capacitor, a first terminal of the sampling capacitor being connected to the input signal when the first switch is closed and to a reference potential when the second switch is closed, and a second terminal of the sampling capacitor being connected to the reference potential when the third switch is closed.

11. An amplifier circuit, comprising:
a sampling circuit configured to sample a voltage of an input signal;
an amplifier having an input terminal connected to an output terminal of the sampling circuit;
a feedback capacitor connected between an output terminal of the amplifier and the output terminal of the sampling circuit;
a quantizer including a comparator that has an input terminal connected to the output terminal of the sampling circuit and configured to quantize voltage at the output terminal of the sampling circuit using a comparison result from the comparator and to output a digital code according to the comparison; and
a control circuit including:
an input terminal connected to the output terminal of the sampling circuit, and
a register for storing a cancellation digital code for cancelling the difference between an offset of the amplifier and an offset of the comparator in response to a code storing signal;
an offset control circuit that outputs the cancellation digital code stored in the register in response to an active calibration signal; and
a signal control circuit that outputs the digital code from the quantizer in response to an inactive calibration signal; and
a first digital-analog (D/A) converter configured to output an analog signal in accordance with digital codes from the control circuit.

12. The amplifier circuit according to claim 11 further comprising:

a controller coupled to the sampling circuit and configured to provide the active and inactive calibration signals.

13. The amplifier circuit according to claim 12, wherein
the controller is further configured to provide a code storing signal, and
the control circuit couples the amplifier output to the output of the first D/A converter in response to an active code storing signal.

14. The amplifier circuit according to claim 11, further comprising:
a second D/A converter configured to generate an analog signal in accordance with the cancellation digital code, wherein
the analog signal generated by the second D/A converter is applied to the input terminal of the comparator while the input signal is being processed.

15. The amplifier circuit according to claim 11, wherein the quantizer is a flash analog-to-digital converter (ADC).

16. The amplifier circuit according to claim 11, wherein the first D/A converter includes:
an output terminal that carries the analog signal output from the first D/A converter;
a plurality of buffers in which one buffer for each bit of the digital code is provided; and
a plurality of capacitors, each capacitor in the plurality of capacitors coupling one buffer in the plurality of buffers to the output terminal of the first D/A converter, wherein
a capacitance value for a capacitor in the plurality of capacitors that corresponds to a more significant bit in the digital code is twice a capacitance value of a capacitor in the plurality of capacitors that corresponds to a less significant bit that is adjacent to the more significant bit in the digital code.

17. The amplifier circuit according to claim 11, wherein
the comparator is configured to perform a plurality of comparisons of a voltage at the output terminal of the sampling circuit to a voltage at a reference potential terminal of the comparator, and
the voltage at the output terminal of the sampling circuit is altered after each comparison of the comparator.

18. The amplifier circuit according to claim 11, wherein the quantizer can be operated at a plurality of quantization levels and a quantization level at which the quantizer operates to process the input signal can be altered according to the cancellation digital code.

19. The amplifier circuit according to claim 11, wherein the sampling circuit includes:
a first switch, a second switch and a third switch; and
a sampling capacitor, a first terminal of the sampling capacitor being connected to the input signal when the first switch is closed and to a reference potential when the second switch is closed, and a second terminal of the sampling capacitor being connected to the reference potential when the third switch is closed.

20. A pipeline analog-to-digital converter, comprising:
an encoder having an encoder output and a plurality of encoder inputs and; and
a plurality of pipeline stages connected in series, each pipeline stage having a stage input and a stage output, each pipeline stage including:
a sub-ADC having an input connected to the stage input and an output connected to one of encoder inputs in the plurality of encoder inputs;
a sub-DAC having an input connected to the output of the sub-ADC and the one of the encoder inputs in the plurality of encoder inputs;
a subtractor connected to the stage input and an output of the sub-DAC, the subtractor configured to provide a difference signal according to a difference between a signal received at the stage input and a signal output from the sub-DAC; and
an amplifier circuit having an input terminal connected to the subtractor at which the difference signal is received, the amplifier circuit including:
a sampling circuit configured to sample a voltage of an input signal;
an amplifier having an input terminal connected to an output terminal of the sampling circuit;
a feedback capacitor connected between an output terminal of the amplifier and the output terminal of the sampling circuit;
a quantizer including a comparator that has a first input terminal connected to the output terminal of the sampling circuit and a second input terminal connected to a reference potential terminal, the quantizer configured to quantize a voltage at the output terminal of the sampling circuit according to a comparison of the voltage at the output terminal of the sampling circuit to a voltage at the reference potential terminal and to output a digital code according to the comparison;
a control circuit receiving the digital code from the quantizer and including a register for storing the digital code as a cancellation digital code for cancelling a difference between an offset of the amplifier and an offset of the comparator; and
a first digital-analog (D/A) converter configured to output an analog signal in accordance with digital codes from the control circuit.

* * * * *